(12) United States Patent
Tanaka et al.

(10) Patent No.: US 11,251,334 B2
(45) Date of Patent: *Feb. 15, 2022

(54) METHOD OF MANUFACTURING LIGHT EMITTING DEVICES

(71) Applicant: NICHIA CORPORATION, Anan (JP)

(72) Inventors: Hiroyuki Tanaka, Tokushima (JP); Yasuo Kato, Anan (JP); Kazuya Matsuda, Anan (JP)

(73) Assignee: NICHIA CORPORATION, Anan (JP)

( * ) Notice: Subject to any disclaimer, the term of this patent is extended or adjusted under 35 U.S.C. 154(b) by 145 days.

This patent is subject to a terminal disclaimer.

(21) Appl. No.: 16/774,565

(22) Filed: Jan. 28, 2020

(65) Prior Publication Data
US 2020/0243710 A1    Jul. 30, 2020

(30) Foreign Application Priority Data

Jan. 28, 2019    (JP) .............................. JP2019-011813

(51) Int. Cl.
*H01L 21/00*    (2006.01)
*H01L 23/495*    (2006.01)
(Continued)

(52) U.S. Cl.
CPC ...... *H01L 33/0095* (2013.01); *H01L 25/0753* (2013.01); *H01L 2933/005* (2013.01);
(Continued)

(58) Field of Classification Search
CPC .................... H01L 33/60; H01L 33/62; H01L 2224/48247; H01L 2224/48257
(Continued)

(56) References Cited

U.S. PATENT DOCUMENTS 7,498,074 B2 *    3/2009    Ueda .......................... C23F 1/02
                                                        428/131
9,263,315 B2 *    2/2016    Oda ......................... H01L 33/56
                                                        24/97
(Continued)

FOREIGN PATENT DOCUMENTS

JP        1-261852 A        10/1989
JP       1995-095577         4/1995
(Continued)

*Primary Examiner* — Calvin Lee
(74) *Attorney, Agent, or Firm* — Birch, Stewart, Kolasch & Birch, LLP

(57) ABSTRACT

A method of manufacturing light emitting devices, the method including: providing a first structure, the providing a first structure including: providing a lead frame, the providing a lead frame including: providing a metal plate having a plurality of pairs of first and second metal parts, each of the first and second metal parts including at least one first region and at least one second region; using an electrodeposition technique, disposing a mask of a resist film on the at least one first region; disposing a first plating containing silver or silver alloy on the at least one second region; and removing the resist film; molding a resin molded body in one piece with the lead frame with parts of a lower surface of the lead frame being exposed, in which, the first structure includes an upper surface defining a plurality of recesses each having an upward-facing surface, at least parts of the first plating being located at the upward-facing surface of each of the plurality of recesses; providing a second structure, the providing a second structure including: disposing at least one light-emitting element on the first plating located at the upward-facing surface of each of the plurality of recesses; and disposing a sealing member covering the at (Continued)

least one light-emitting element in each of the plurality of recesses; and separating the second structure into a plurality of individual light emitting devices.

19 Claims, 18 Drawing Sheets

(51) Int. Cl.
*H01L 33/00* (2010.01)
*H01L 25/075* (2006.01)
(52) U.S. Cl.
CPC ............. *H01L 2933/0033* (2013.01); *H01L 2933/0066* (2013.01)
(58) Field of Classification Search
USPC .................................. 257/676; 438/121–124
See application file for complete search history.

(56) References Cited

U.S. PATENT DOCUMENTS

| | | | |
|---|---|---|---|
| 9,461,220 B2* | 10/2016 | Ikenaga | H01L 33/46 33/62 |
| 2012/0132949 A1 | 5/2012 | Watari et al. | |
| 2020/0176649 A1* | 6/2020 | Tanaka | H01L 33/56 33/60 |

FOREIGN PATENT DOCUMENTS

| | | |
|---|---|---|
| JP | 9-199654 A | 7/1997 |
| JP | 10-142807 A | 5/1998 |
| JP | 2006-093559 A | 4/2006 |
| JP | 2008-192837 A | 8/2008 |
| JP | 2011-129687 A | 6/2011 |
| JP | 2011-151069 A | 8/2011 |
| JP | 2012-114286 A | 6/2012 |
| JP | 2012-174966 A | 9/2012 |
| JP | 2012182215 | 9/2012 |
| JP | 2013-145862 A | 7/2013 |
| JP | 2013-207036 A | 10/2013 |
| JP | 2013-214677 A | 10/2013 |
| JP | 2013-236113 A | 11/2013 |
| JP | 2014-064031 A | 4/2014 |
| JP | 2014-207481 A | 10/2014 |
| JP | 2015-144302 A | 8/2015 |
| JP | 2016-026398 A | 2/2016 |
| JP | 2016-106423 A | 6/2016 |
| JP | 2017-076806 A | 4/2017 |
| JP | 2017-076809 A | 4/2017 |
| JP | 2017-092500 A | 5/2017 |
| JP | 2018-014352 A | 1/2018 |
| JP | 2018-022817 A | 2/2018 |

* cited by examiner

METHOD OF MANUFACTURING LIGHT EMITTING DEVICES

CROSS-REFERENCE TO RELATED PATENT APPLICATION

The present application claims priority under 35 U.S.C. § 119 to Japanese Patent Application No. 2019-011813, filed Jan. 28, 2019. The contents of Japanese Patent Application No. 2019-011813 are incorporated herein by reference in their entirety.

BACKGROUND OF THE INVENTION

Technical Field

The present disclosure is related to a method of manufacturing light emitting devices.

Description of Related Art

For example, a method of manufacturing a lead frame in which a mask is disposed on a surface of a lead frame to form a plating on parts of the lead frame is described in, for example, Japanese Unexamined Patent Application Publication No. 2008-192837.

SUMMARY OF THE INVENTION

In such a method as described in Japanese Unexamined Patent Application Publication No. 2008-192837, selective apply of plating only on desired regions at corners and/or lateral surfaces of a lead frame may be difficult due to, for example, difficulty in precisely disposing a mask on such corners and/or lateral surfaces.

Accordingly, an object of certain embodiments of the present invention is to provide a method of manufacturing light emitting devices that can facilitate plating of desired regions of a lead frame.

A method of manufacturing light emitting devices according to one embodiment of the present invention includes: providing a first structure, the providing a first structure including: providing a lead frame, the providing a lead frame including: providing a metal plate having a plurality of pairs of first and second metal parts, each of the first and second metal parts including at least one first region and at least one second region, using an electrodeposition technique, disposing a mask of a resist film on the at least one first region, disposing a first plating containing silver or silver alloy on the at least one second region, and removing the resist film; providing a resin molded body molded in one piece with the lead frame with parts of a lower surface of the lead frame being exposed, in which, the first structure includes an upper surface defining a plurality of recesses each having an upward-facing surface, at least parts of the first plating being located at the upward-facing surface of each of the plurality of recesses; providing a second structure, the providing a second structure including: disposing at least one light-emitting element on the first plating located at the upward-facing surface of each of the plurality of recesses; and disposing a sealing member covering the at least one light-emitting element in each of the plurality of recesses; and separating the second structure into a plurality of individual light emitting devices.

Using the method of manufacturing according to certain embodiments of the present invention, deposition of plating onto desired regions of a lead frame can be facilitated.

DETAILED DESCRIPTION OF EMBODIMENTS

Figure 1A:
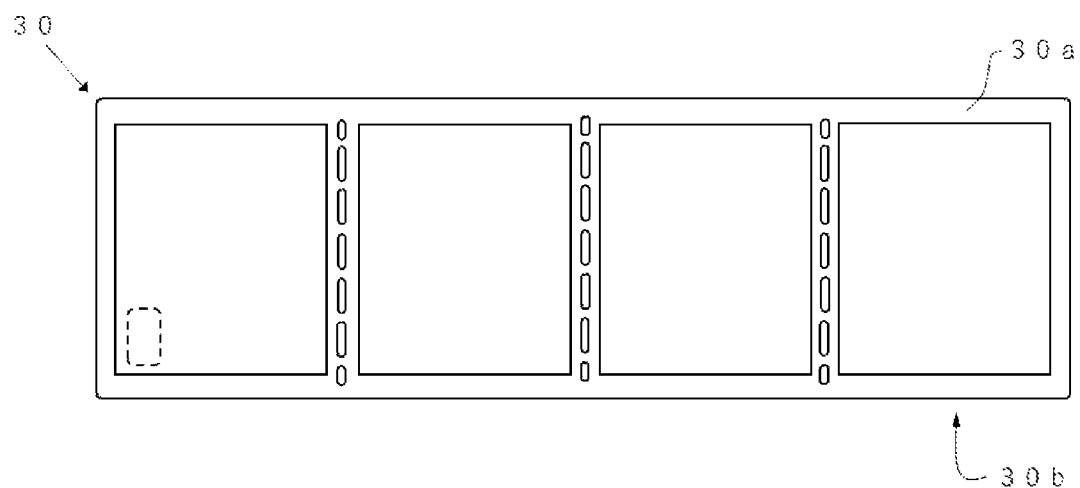
FIG. 1A is a schematic top view of a metal plate according to one embodiment.

Certain embodiments of the present invention will be described below with reference to the drawings. The embodiments described below are intended as illustrative and the method of manufacturing light-emitting devices according to the present invention is not limited to those embodiments described below. For example, numeral values, shapes, materials shown in the embodiments are given illustrative and various changes may be made unless any technical contradiction arises.

The sizes, shapes, or the like of the components in the drawings may be occasionally shown exaggerated for ease of understanding, and may not represent actual dimensions and/or shapes in the actual lead frame and/or light emitting device etc., and/or relationships between the sizes of the components in the actual lead frame and/or light emitting device. Also, in order to avoid excessively complicating drawings, one or more components may not be shown in some drawings.

In the description below, the same designations or the same reference numerals denote the same or like members and detailed descriptions will be appropriately omitted. In the description below, terms which indicate specific directions or locations (for example, "up", "down" and other terms expressing those) may be applied. Those terms are used to express relative directional relationship or positional relationship between the components in a drawing which is referred to for the ease of understanding. In the present specification, the terms such as "upper" and "lower" are used to illustrate a relative direction or relative locational relationship between the components in a drawing which is referred to, and unless specifically indicated, are not intended to show absolute positional relationship. It will also be understood that those terms are intended to include different orientations in a drawing, an actual device and/or manufacturing devices as long as relative directional relationship or positional relationship between the components are the same orientation depicted in the drawings.

In the present specification, terms such as "metal part(s)", "lead(s)", or the like may be used both before and after separating.

Figure 3A:
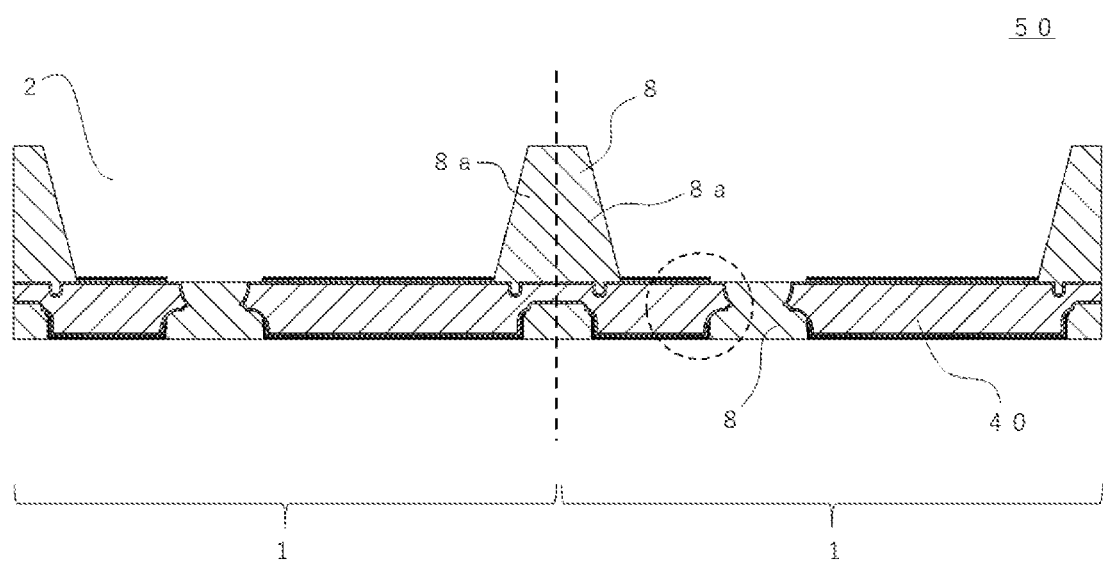
FIG. 3A is a schematic cross-sectional end plan view of a first structure according to one embodiment.

A method of manufacturing light-emitting devices 100 according to certain embodiments of the present disclosure includes: providing a first structure 50; forming a second structure 60; and separating the second structure into a plurality of individual light-emitting devices 100. The providing the first structure 50 includes (A) providing a metal plate 30, (B) forming a lead frame 40 having a first plating 5 containing silver or silver alloy on one or more predetermined regions, and (C) forming a resin molded body 8 in one piece with the lead frame 40, as shown in FIG. 3A.

These operations will be described in detail below with reference to FIG. 1A through FIG. 5D.

(A) Providing Metal Plate 30

Figure 1B:
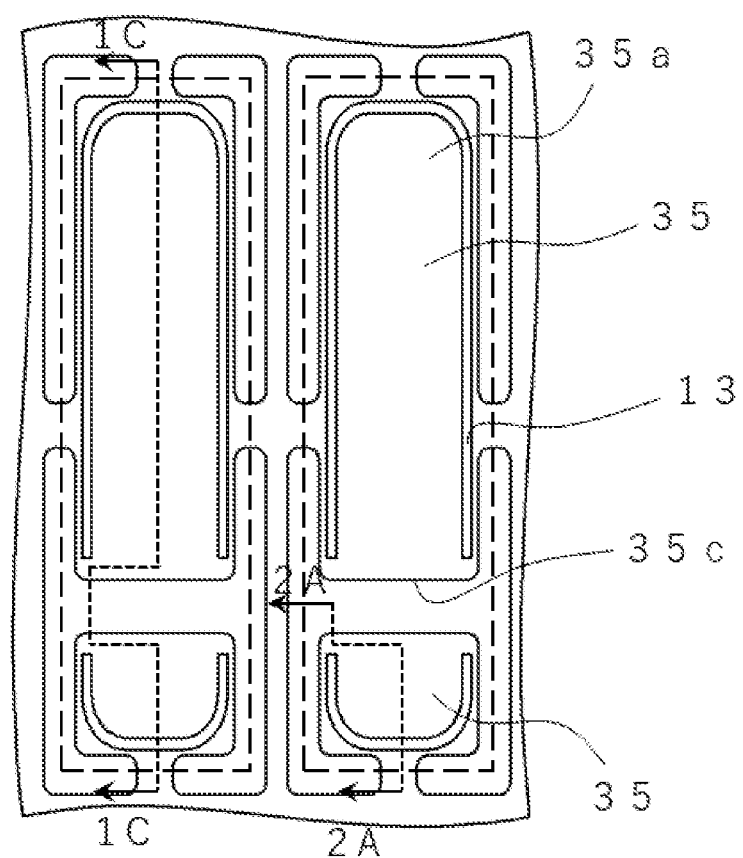
FIG. 1B is a partially enlarged view of a portion encircled with a broken line in FIG. 1A.
Figure 1C:
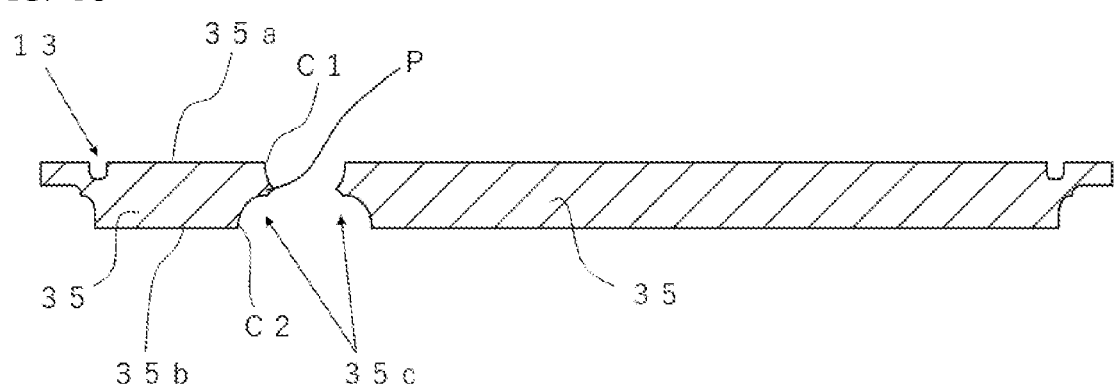
FIG. 1C is a schematic cross-sectional end plan view taken along line 1C-1C of FIG. 1B.

A metal plate 30 having an upper surface 30a and a lower surface 30b, and including a plurality of pairs of first and second metal parts 35 opposite to each other at respective end surfaces 35c, is provided. The metal plate 30 may be provided by purchasing a manufactured metal plate 30, or by manufacturing a metal plate 30, applying etching or pressing to a flat-plate-shaped metal made of copper, copper alloy, or nickel alloy. FIG. 1A is a schematic top plan view, seen from an upper surface side of the metal plate 30. FIG. 1B is a partially enlarged view of a portion encircled with a broken line in FIG. 1A, showing two pairs of metal parts 35. FIG. 1C is a schematic cross-sectional end plan view taken along line 1C-1C of FIG. 1B. In the present specification, the term "first end surface 35c" refers to a surface between the upper surface and the lower surface of each pair of the first and second metal parts 35, at which the first and second metal parts 35 face each other.

Each of the metal parts 35 shown in FIG. 1C includes a first corner portion C1 and a second corner portion C2, the first corner portion C1 connecting the upper surface 35a and the first end surface 35c of the metal part, and a second corner portion C2 connecting the lower surface 35b and the first end surface 35c of the metal part 35. In the present specification, the term "corner portion" may partially include a curved portion. In each of the pairs of metal parts 35, the metal parts 35 are arranged such that, compared to the second corner portion C2, the first corner portion C1 of the first metal part 35 is located closer to the second metal part 35, and vice versa, compared to the second corner portion C2, the first corner portion C1 of the second metal part 35 is located closer to the first metal part 35. Further, the first end surfaces 35c of the first and second metal parts 35 of each of the pairs of metal parts 35 respectively have a protrusion P located closer to the other metal part 35 of the pair than either the first corner portion C1 or the second corner portion C2 to the other metal part 35. Providing the protrusion P can easily increase the surface area of each first end surface 35c, which can increase adhesion strength of the metal parts 35 to the resin molding 8 to be described later below.

Further, as shown in FIG. 1B, the first and second metal parts 35 may be formed with one or more grooves 13 or one or more through-holes in respective upper surfaces 35a. With this arrangement, the resin molded body 8 can be engaged in the grooves 13 or the through-holes, which allows for secure bonding between each of the pairs of metal parts 35 (portions to be a pair of lead parts 36) and corresponding portions of the resin molded body 8. Forming the one or more grooves 13 or one or more through-holes may be performed in combination with the forming pairs of metal parts 35, or may be performed separately.

(B) Forming Lead Frame 40

Figure 2A:
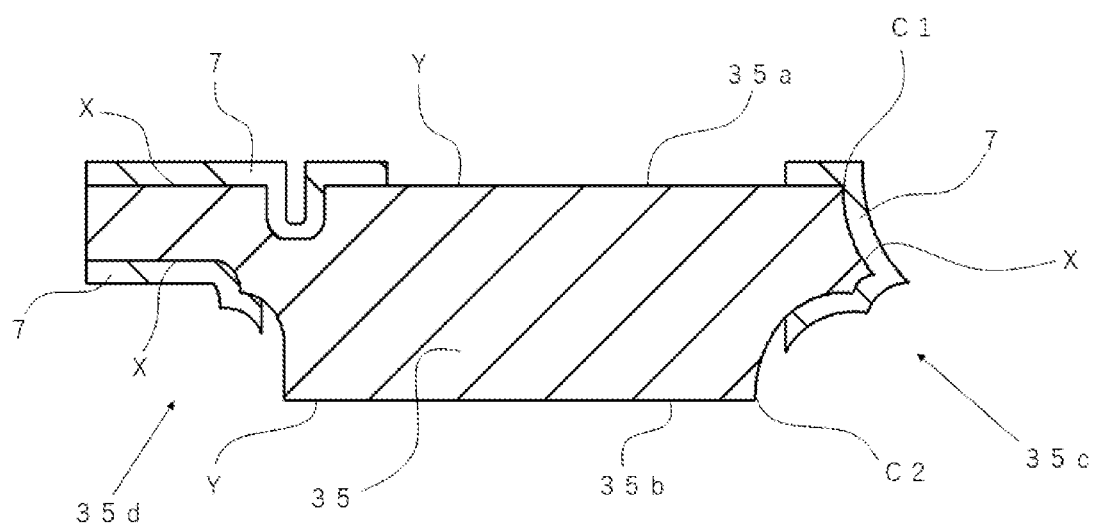
FIG. 2A is a schematic cross-sectional end plan view of a metal part having portions of a resist film on a first region.

Next, an electrodeposition method is used to provide a resist film 7 on the first regions X on the surfaces of the metal parts 35. FIG. 2A is a schematic cross-sectional end plan view taken along line 2A-2A of FIG. 1B, illustrating one of the plurality of pairs of metal parts 35 with the first regions X provided with the resist film 7. In FIG. 2A, a portion of the resist film 7 continuously covers an upper portion of the first end surface 35c and a portion of an upper surface 35a adjacent to the upper portion of the first end surface 35c of the metal part 35. Other portions of the resist film 7 cover an upper portion of a second end surface 35d located opposite side of the first end surface 35c, and a portion of the upper surface 35a of the metal part 35. The resist film 7 may be disposed to cover either a portion or an entire of the first end surface 35c. Further, the resist film 7 is preferably disposed to continuously cover either a first corner portion C1 connecting the upper surface 35a and the first end surface 35c of the one of the pair of metal part 35 or a second corner portion C2 connecting a lower surface 35b and the first end surface 35c of the one of the pair of metal part 35, or both the first corner portion C1 and the second corner portion C2. With this arrangement, after removing the resist film 7, a first plating 5 containing silver or silver alloy does not present in the first regions of the metal part 35 such that migration of silver can be reduced and that a decrease in a total luminous flux due to degradation of silver or silver alloy can be reduced. Moreover, the usage amount of silver or silver alloy can be reduced, which can reduce manufacturing cost of the light emitting devices.

As shown in FIG. 2A, the surfaces of each of the metal parts 35 has first regions X provided with the resist film 7 and second regions Y where the resist film 7 has been removed or the resist film 7 is not disposed. On the second regions Y, a first plating 5 containing silver or silver alloy is disposed in a later operation in the manufacturing. At least one light emitting element 10 is to be mounted on the first plating 5.

Disposing a resist film 7 on the first regions X of the metal parts 35 may include operations illustrated below.

(B-1) Disposing Resist Film 7 by Using Electrodeposition Method

Figure 2B:
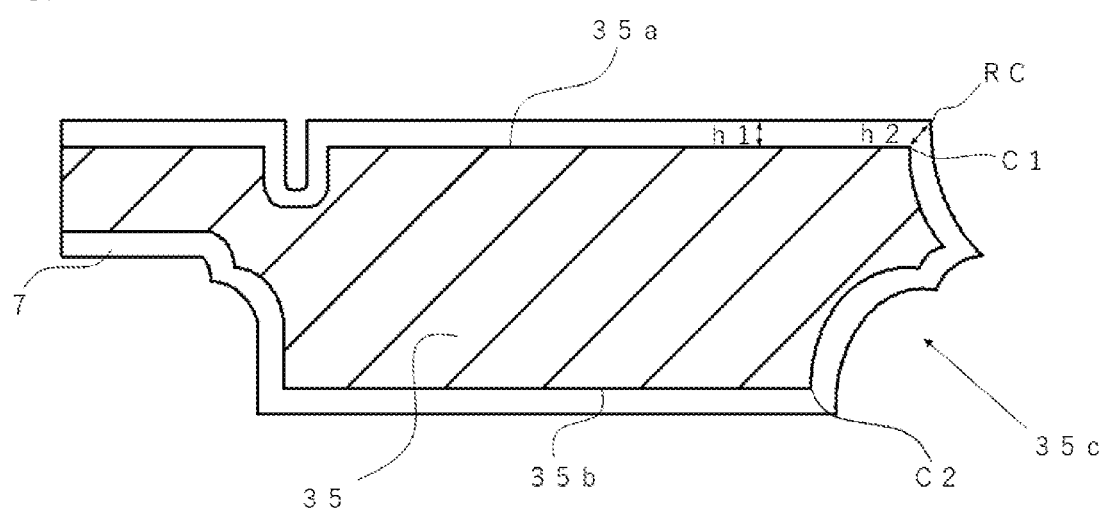
FIG. 2B is a schematic cross-sectional end plan view of a metal part on which a resist film is disposed.

A metal plate 30 is immersed in an aqueous solution containing a material to be served as charged particles (for example acrylic polymer) and a material to be a predetermined resist film 7, and electricity is applied. The immersing is performed, for example, at a voltage in a range of 100 V to 250 V and an immersion time in a range of 10 to 30 seconds, preferably at a voltage in a range of 150 V to 200 V and an immersion time in a range of 10 to 20 seconds. Accordingly, as shown in FIG. 2B, the resist film 7 is disposed on the surfaces including the upper surface 35a, the lower surface 35b, the first end surface 35c, and the corners of each of the metal parts 35 of the pairs of metal parts 35. In FIG. 2B, the hatching of the resist film 7 is omitted for easy understanding. For the material of the resist film 7, a light-sensitive photo resist material can be preferably used. Using a photoresist material for the resist film 7 allows irradiation of light to desired regions, which allows removing unnecessary portions by using a developing solvent, such that the resist film 7 can be efficiently processed.

(B-2) Drying Resist Film 7

The metal plate 30 is taken out from the aqueous solution and drying is performed by applying heat to the resist film 7. Heat is applied to the metal plate 30 having the resist film 7 disposed thereon for, for example, in a range of 45 to 90 seconds at a temperature in a range of 60 to 100° C., suitably in a range of 60 to 90 seconds at a temperature in a range of 60 to 80° C. This allows for a reduction in the difference in the thicknesses of the resist film 7 formed on the surfaces of the metal plate 30. With the drying described above, components of the resist film 7 are efficiently adhered in the vicinity of corners of the respective metal parts 35, which facilitates covering the corners of the metal parts 35 by the resist film 7.

Reliable application of the mask or resist film 7 on the corners and/or end surfaces of respective second metal parts 25 may be difficult to obtain by using conventional methods using a mask and/or disposing a resist film 7. However, the resist film 7 is disposed by using an electrodeposition method in the method of manufacturing light-emitting devices according to the present disclosure that allows facilitating disposing the resist film 7 on desired regions of the respective metal parts 35.

Moreover, when using a conventional method in which the resist film 7 is formed by applying a coating, the resist film 7 tends to have a thickness smaller at corners of the metal parts 35 than a thickness at the upper surfaces 35$a$ and the lower surfaces 35$b$ of the metal parts 35. However, according to the embodiments of the present invention, the resist film 7 is formed by using an electrodeposition method, allowing for a reduction in the difference in thickness between the resist film 7 disposed on the corners of the metal parts 35 and the resist film 7 disposed on the upper surfaces 35$a$ and the lower surfaces 35$b$ of the metal parts 35. Accordingly, an unintentional formation of the first plating that contains silver or silver alloy on the corners of the metal parts 35 can be reduced or prevented. The thickness h1 of the resist film on the upper surfaces 35$a$ of the metal parts 35 and the thickness h2 of the resist film on the first corner portion C1 or the second corner portion C2 of the corresponding metal parts 35 has a difference in a range of 0 to 30 μm, preferably in a range of 0 to 5 μm. In this range of difference, possibility of insufficient hardening of the resist film 7 when exposed to light in a later in the method operation can be reduced. Also, removing of the resist film 7 performed later in the method can be facilitated. In FIG. 2B, the thickness h2 of the resist film 7 on the first corner portion C1 or on the second corner portion C2 of the metal part 35 depicts a distance between the first corner portion C1 or the second corner portion C2 of the metal part 35 and the corner RC of the resist film 7.

The resist film 7 formed on the surfaces of the respective surfaces of the metal plate 30 preferably has a thickness of, for example, 20 μm or less, preferably 10 μm or less. When the resist film 7 has a thickness of 20 μm or less, variation in thickness of the resist film 7 can be sufficiently reduced. Also, when the resist film 7 has a thickness of 20 μm or less, removing of the resist film 7 in later operation in the method can be facilitated. However, the resist film 7 having a thickness greater than 20 μm can also be employed.

(B-3) Removing Resist Film 7 Other Than on First Regions X

Next, the resist film 7 disposed on regions other than the first regions X is removed. The removing the resist film includes, for example, irradiating light to predetermined regions of the surfaces of the metal parts 35, and removing unnecessary portions of the resist film 7 by using a developing solvent.

When a negative-type photoresist material is used for the resist film 7, in order to render the portions of the resist film 7 located in the first regions X insoluble to the predetermined developing solvent, light is irradiated from above or/and below the metal plate 30 to portions of the resist film 7 located in the first regions X. The metal plate 30 is then immersed in the developing solvent or using a sprayer etc., the developing solvent is sprayed onto the surfaces of the metal plate 30. Thus, portions of the resist film 7 located on the second regions Y of the metal part 35 that is the regions other than the first regions X are removed by using the developing solvent. In order to enhance adhesion between the resist film 7 and the metal parts 35, a heat treatment may be performed after the developing. Through the operations as described above, the metal plate 30 having the metal parts 35 provided with the resist film 7 only on the first regions X of the surfaces of the respective metal parts 35 as shown in FIG. 2A can be obtained.

Meanwhile, when a positive-type photoresist material is used for the resist film 7, in order to render the portions of the resist film 7 located in the second regions Y soluble to the predetermined developing solvent, light is irradiated from above or/and below the metal plate 30 to portions of the resist film 7 located in the second regions Y. The metal plate 30 is then immersed in the developing solvent or the developing solvent is sprayed onto the surfaces of the metal plate 30. Thus, portions of the resist film 7 located on the second regions Y are removed by using the developing solvent. In order to enhance adhesion between the resist film 7 and the metal parts 35, a heat treatment may be performed after the developing. Through the operations as described above, the metal plate 30 having the metal parts 35 provided with the resist film 7 only on the first regions X of the surfaces of the respective metal parts 35 as shown in FIG. 2A can be obtained.

Figure 2C:
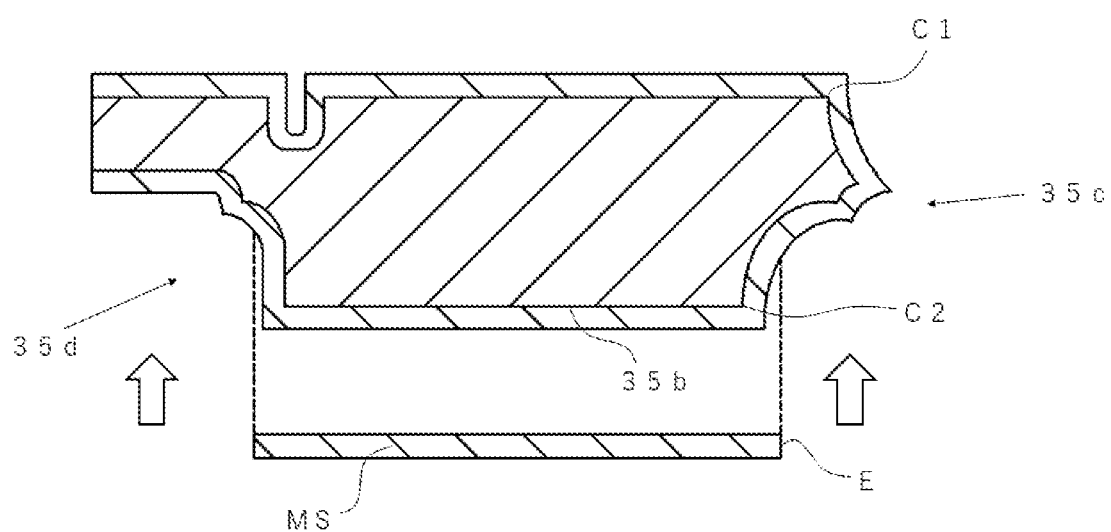
FIG. 2C is a schematic cross-sectional end plan view of an example of exposing to light.

The exposing to light can be performed, for example, arranging a light-shielding mask and irradiating light. FIG. 2C illustrates exposing to light using a negative type photoresist material and a light shielding mask MS. FIG. 2C is a schematic cross cut surface end surface view in a direction perpendicular to the upper surface of the metal part 35. In FIG. 2C, the first corner portion C1 is located outward with respect to the second corner portion C2. The light-shielding mask can be used repeatedly by washing. The exposing to light can also be performed using a light-irradiation device configured to irradiate light with a predetermined pattern. As the exposure device, for example, a maskless exposure device, a direct-imaging device, or a direct-patterning exposure device can be used.

In the removing resist film 7 (step B-3) that includes the step of exposing, the resist film 7 located on the entire lower surface of the metal part 35 is preferably removed. With this, in the disposing first plating 5 (step B-4) to be described below, the first plating 5 can be disposed on the entire lower surface of the metal part 35. As a result, for example, bonding between the light emitting device 100 and the mounting substrate through a solder material can be improved.

In order to remove the resist film 7 located on the entire lower surface of the respective metal parts 35, for example, exposure to predetermined light as shown in FIG. 2C may be performed. More specifically, in the example shown in FIG. 2C, a light-shielding mask MS is arranged to cover the lower surfaces of the respective metal parts 35, in which edges E of the light-shielding mask MS are positioned between the first corner portion C1 and the corresponding second corner portion C2 of each of the metal part 35, then the light is irradiated to the resist film 7 from below the metal plate 30. With this arrangement, the lower surface 35$b$ and a portion of the first end surface 35$c$ continuous to the lower surface 35$b$ of each of the metal parts 35 can be prevented from exposure to the light, such that portions of the resist film 7 located at the regions that have not exposed to the light can be prevented from being rendered insoluble in the developing solvent. Accordingly, portions of the resist film 7 located on the lower surface 35$b$ and the portion of the first end surface 35$c$ continuous to the lower surface 35$c$ of each of the metal parts 35 can be easily removed by using the developing solvent. The same can be performed on the end surface 35$d$ of the metal part 35 located opposite side from the first end surface 35$c$. Further, when using an irradiating device configured to irradiate a predetermined patterned light in the exposing, the ends of the patterning light are positioned between the first corner portions C1 and the second corner portions C2 of the respective metal parts 35 such that portions outward of the ends (i.e., the first corner portion C1 sides) are exposed to the light.

Figure 2D:
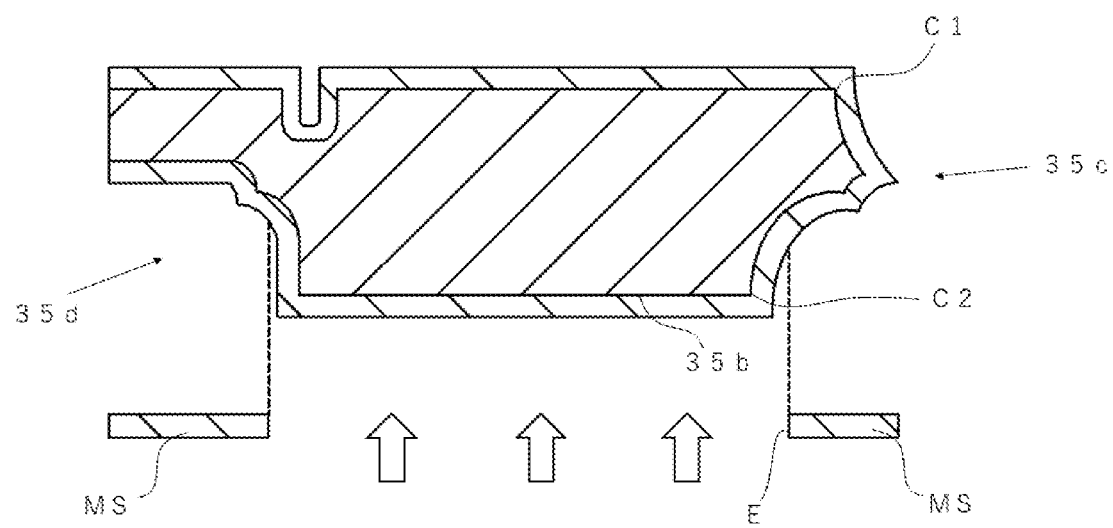
FIG. 2D is a schematic cross-sectional end plan view of another example of exposing to light.

When a positive-type photoresist material is used, the ends of the light-shielding mask MS or the ends of the patterning light of the irradiating device are positioned between the first corner portions and the second corner portions C2 of the respective metal parts 35 such that as shown in FIG. 2D, light is irradiated to the lower surfaces 35$b$ and portions of the end surfaces 35$c$ continuous to the lower surfaces 35$b$ of the respective metal parts 35. Accordingly, portions of the resist film 7 located on the lower surface 35$b$ and the portion of the first end surface 35$c$ continuous to the lower surface 35$c$ of each of the metal parts 35 can be rendered soluble to the developing solvent. Accordingly, portions of the resist film 7 located on the lower surface 35$b$ and the portion of the first end surface 35$c$ continuous to the lower surface 35$c$ of each of the metal parts 35 can be easily removed by using the developing solvent.

At the lower surfaces 35$b$ of the metal parts 35, the resist film 7 may not be removed or partially removed. When removing only portions of the resist film 7, for example, portions of the resist film 7 located at center regions that include geometric centers of the lower surfaces 35$b$ are removed such that portions of the resist film 7 located at peripheries of the lower surfaces 35$b$ are remained. Alternatively, portions of the resist film 7 located at peripheries of the lower surfaces 35$b$ are removed and portions of the resist film 7 located at center regions that include geometric centers of the lower surfaces 35$b$ are remained. With this arrangement, at the lower surfaces of the metal parts 35, the surfaces of the metal parts 35 may be exposed, or portions of the second plating 6 to be described below are located, such that migration of silver can be reduced or prevented, and/or that a decrease in a total luminous flux due to degradation of silver or silver alloy by sulfurization can be reduced or prevented.

(B-4) Disposing First Plating 5

Figure 2E:
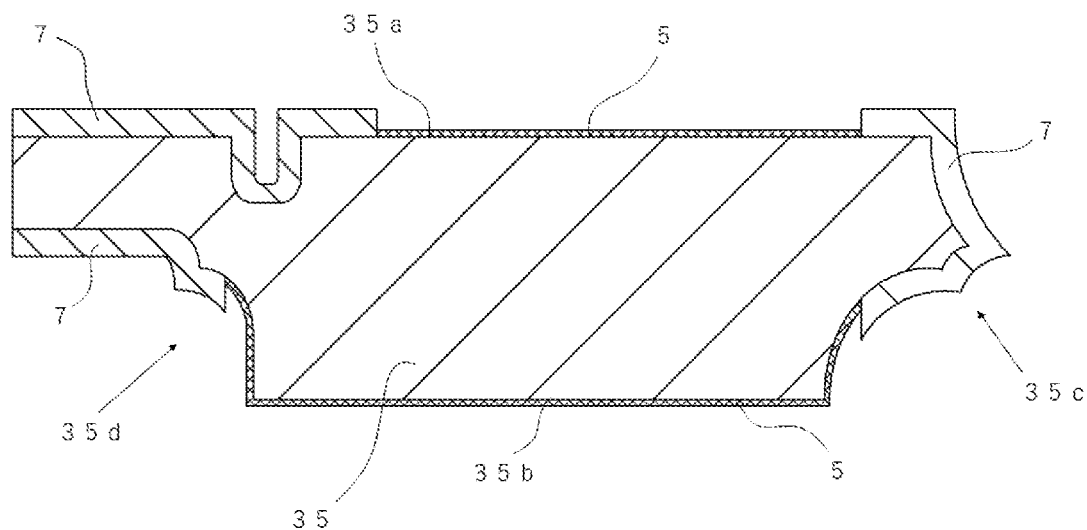
FIG. 2E is a schematic cross-sectional end plan view illustrating disposing a first plating.
Figure 2F:
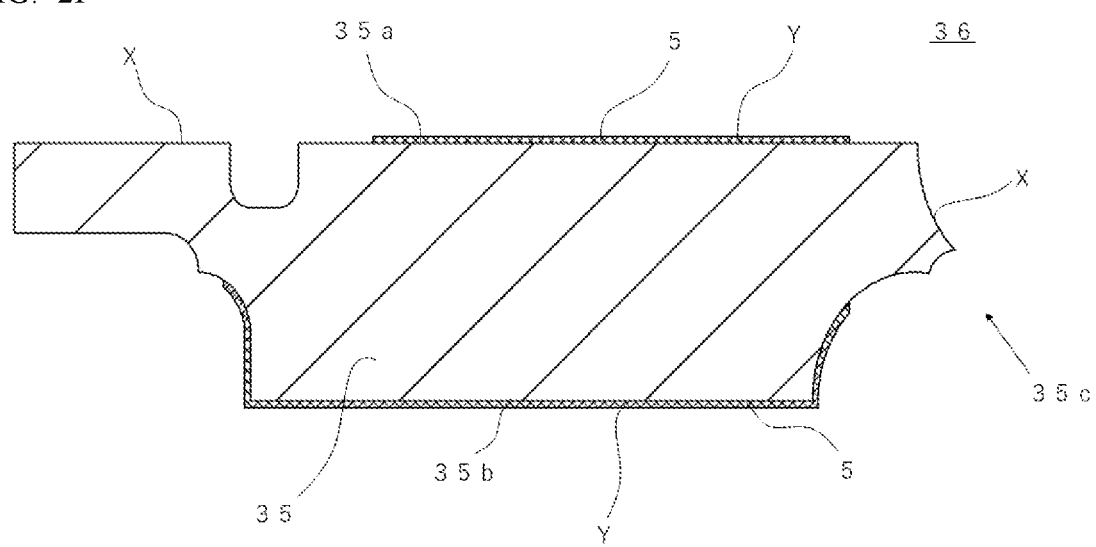
FIG. 2F is a schematic cross-sectional end plan view illustrating removing the resist film.

Next, first plating 5 containing silver or silver alloy may be disposed on the metal plate 30 disposed with the resist film on the first regions X. The first plating 5 is partial plating. For plating, an electrolytic plating method or an electroless plating method can be employed. As shown in FIG. 2E, the first plating 5 is disposed at least on the upper surfaces 35$a$ of the respective metal parts 35. Herein, the expression "disposing the first plating on the upper surface" includes cases in which the plating is disposed directly on the upper surface and in which the plating is disposed indirectly on the upper surface through another plating. In other words, the first plating 5 may be in direct contact with the upper surfaces 35$a$ of the respective metal parts 35 or may not be in direct contact with the upper surfaces 35$a$ of the respective metal parts 35. For example, a second plating 6 may be disposed between the first plating 5 and the upper surfaces 35$a$ of the metal parts 35, in such a case, the first plating 5 is located indirectly on the upper surfaces 35$a$ of the respective metal parts 35 via the second plating 6.

In FIG. 2E, the first plating 5 is disposed at the upper surface 35$a$ side, the lower surface 35$b$ side, the first end surface 35$c$ side, and the end surface side 35$d$ that is opposite side from the first end surface 35$c$ on the metal part 35. Disposing the first plating 5 containing silver or silver alloy on the surfaces of the metal parts 35 allows efficient extraction of light emitted from the at least one light emitting element 10 to the outside. The first plating 5 has a thickness of, for example 0.1 μm or greater, preferably 0.5 μm or greater, more preferably 1 μm or greater. Accordingly, light, for example, emitted from the at least one light emitting element 10 can be efficiently reflected.

The first plating 5 contains silver or silver alloy, for example, 85 mass % or greater, preferably 90 mass % or greater. Accordingly, light, for example, emitted from the at least one light emitting element 10 can be efficiently reflected. When the first plating 5 is silver alloy, silver-gold alloy, silver-indium alloy, or silver-palladium alloy can be used.

(B-5) Removing Resist Film 7 Located on First Regions X

The resist film 7 on the first regions X is then removed by using a resist removing solution. When the first plating 5 is disposed on the surfaces of the resist film 7, the resist film 7 and the first plating 5 on the surfaces of the resist film 7 are removed together. Through the operation described above, a lead frame 40 as shown in FIG. 2F, having lead portions 36 each including a first region X absent of the first plating 5 and a second region Y disposed with the first plating 5 can be obtained. In the description below, the metal plate 30 provided with the first plating 5 is referred to as "lead frame 40" and each pair of the metal parts 35 provided with the first plating 5 are respectively referred to as "lead parts 36".

(B-6) Disposing Second Plating 6

The forming lead frame 40 preferably includes disposing second plating 6 on surfaces of the metal parts 35, before the disposing first plating 5 (step B-4). The second plating 6 can be disposed by using, electrolytic plating or electroless plating. The second plating 6 cab be disposed to cover the first regions X or both the first regions X and the second regions Y. With the second plating 6 located on the surfaces of the metal parts 35, the surfaces of the metal part 30 made of copper alloy or the like can be prevented from being exposed to the outside, which can reduce or prevent oxidation of the surfaces. Also, the arrangement described can reduce the possibility of migration of components such as copper contained in the metal plate 30 on the surface of the first plating 5 that is an outermost layer. Accordingly, for example, a reduction of connecting strength between the first plating 5 and the wires can be reduced or prevented when the electrodes of the at least one light emitting element 10 and the first plating 5 are connected by using wires or the like (wires, a bonding member, etc). The second plating 6 may be disposed on the entire surfaces of the respective metal parts 35, or may be disposed on portions of the surfaces of the respective metal parts 35. When the lead frame 40 has the first plating 5 and the second plating 6, the first plating 5 may be an outermost layer with the second plating 6 as an intermediate layer or an underlayer.

The second plating 6 includes one or a plurality of metal layers respectively contain, for example, copper, copper alloy, gold, gold alloy, nickel, nickel alloy, palladium, palladium alloy, rhodium, rhodium alloy, or the like. The second plating 6 substantially does not contain silver or silver alloy. In the specification, the expression "substantially does not contain silver or silver alloy" does not exclude inevitable inclusion of silver or silver alloy and a content of silver or silver alloy, for example, not greater than 0.05% by mass may be allowed. When the second plating 6 includes a plurality of layers, the second plating 6 may have, for example, in order from the metal part 35 side, a metal layer containing nickel or nickel alloy, a metal layer containing palladium or palladium alloy, and a metal layer containing gold or gold alloy. In place of the second plating 6 that is disposed by plating, a metal layer may be disposed by sputtering or vapor deposition, or applying an electrically conductive paste. For the metal layer, the materials illustrated for the second plating 6 can be used.

Plating the second plating 6 (step B-6) can be performed, for example, after the providing a metal plate 30 (step A) and before the forming a lead frame 40 (step B), or after the removing resist film 7 other than that on the first regions X (step B-3) and before the disposing a first plating 5 (step B-4). When the second plating 6 includes a plurality of layers, disposing each layer can be performed at once between the providing a metal plate 30 (step A) and the forming a lead frame 40 (step B) or between the removing resist film 7 other than that on the first regions X (step B-3) and the disposing a first plating 5 (step B-4), or separately between the providing a metal plate 30 (step A) and the forming a lead frame 40 (step B) and between the removing resist film 7 other than that on the first regions X (step B-3) and the disposing a first plating 5 (step B-4). For example, when the second plating 6 includes a metal layer containing nickel etc., a metal layer containing palladium etc., and a metal layer containing gold etc., the metal layer containing nickel etc., the metal layer containing palladium etc., and the metal layer containing gold etc., can be disposed between the providing a metal plate 30 (step A) and the forming a lead frame 40 (step B), or between the removing resist film 7 other than that on the first regions X (step B-3) and the disposing a first plating 5 (step B-4), or the metal layer containing nickel etc., can be disposed between the providing a metal plate 30 (step A) and the forming a lead frame 40 (step B) and the metal layer containing palladium etc., and the metal layer containing gold etc., can be disposed between the removing resist film 7 other than that on the first regions X (step B-3) and the disposing a first plating 5 (step B-4).

Figure 2G:
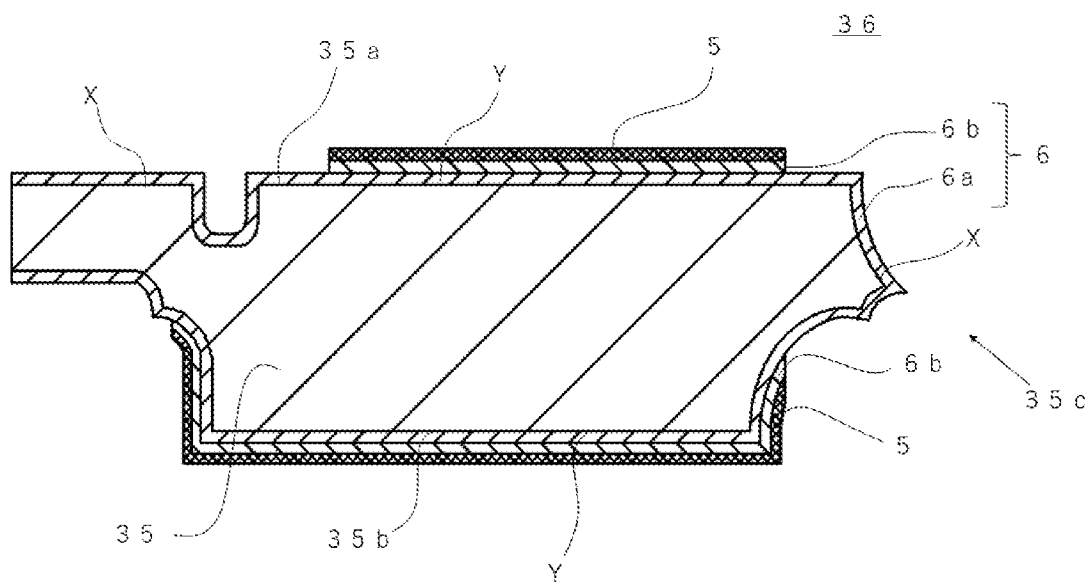
FIG. 2G is a schematic cross-sectional end plan view showing an example of a lead part.

In FIG. 2G, an example of a lead part 36 having the first plating 5 and the second plating 6 is illustrated. The second plating 6 shown in FIG. 2G includes a lower metal layer 6a and an upper metal layer 6b. The lower metal layer 6a of the second plating 6 can be disposed, for example, between the providing a metal plate 30 (step A) and the forming a lead frame 40 (step B) to cover both the first regions X and the second regions Y. The upper metal layer 6b is formed, for example, between the removing resist film 7 from regions other than first regions X (step B-3) and the disposing a first plating (step B-4) to cover the second regions Y. With the lower metal layer 6a covering both the first regions X and the second regions Y, exposure of the surfaces of the metal parts 35 to the outside can be prevented, which can prevent or reduce oxidation of the surfaces. Further, covering the second regions Y of the metal parts 35 by the upper metal layer 6b can reduce deposition of the components such as copper of the metal parts 35 onto the surfaces of the first plating 5 that is the uppermost layer.

The thickness of the first plating 5 may be substantially the same at the upper surface 30a side and the lower surface 30b side of the metal plate 30, or the thickness of the first plating 5 may be greater at the upper surface 30a side than the lower surface 30b side of the metal plate 30, or the thickness of the first plating 5 may be smaller at the upper surface 30a side than the lower surface 30b side of the metal plate 30. For example, when using electroplating, insulating shields of different size are arranged between the cathode and anode at the upper surface 30a side and the lower surface 30b side of the metal plate 30 to obtain different cathode current density distributions, such that the first plating 5 can be disposed easily and simultaneously with different thickness on the upper surface 30a side and the lower surface 30b side. When the thickness of the first plating 5 on the upper surface 30a side of the metal plate 30 is greater than the thickness of the first plating 5 on the lower surface 30b side of the metal plate 30, flatness of the first plating 5 on the upper surface 30a side is improved, such that light emitted from the at least one light-emitting element 10 can be efficiently reflected upward. When the thickness of the first plating 5 on the upper surface 30a side of the metal plate 30 is smaller than the thickness of the first plating 5 on the lower surface 30b side of the metal plate 30, and when the light-emitting device 100 is mounted on a mounting substrate via a bonding member, bonding strength between the light-emitting device 100 and the bonding member can be improved.

The thickness of the second plating 6 may be substantially the same at the upper surface 30a side and the lower surface 30b side of the metal plate 30, or the thickness of the second plating 6 may be greater at the upper surface 30a side than the lower surface 30b side of the metal plate 30, or the thickness of the second plating 6 may be smaller at the upper surface 30a side than the lower surface 30b side of the metal plate 30. For example, when using electroplating, insulating shields of different size are arranged between the cathode and anode at the upper surface 30a side and the lower surface 30b side of the metal plate 30 to obtain different cathode current density distributions, such that the second plating 6 can be disposed easily and simultaneously with different thickness on the upper surface 30a side and the lower surface 30b side. When the thickness of the second plating 6 on the upper surface 30a side of the metal plate 30 is greater than the thickness of the second plating 5 on the lower surface 30b side of the metal plate 30, flatness of the first plating 5 on the upper surface 30a side is improved, such that light emitted from the at least one light-emitting element 10 can be efficiently reflected upward. When the thickness of the second plating 6 on the upper surface 30a side of the metal plate 30 is smaller than the thickness of the second plating 6 on the lower surface 30b side of the metal plate 30, and when the light-emitting device 100 is mounted on a mounting substrate via a bonding member, bonding strength between the light-emitting device 100 and the bonding member can be improved. When the second plating 6 includes a plurality of layers, the thickness of the second plating 6 described above may be the thickness of each of the layers or may be a total thickness of the plurality of layers. Accordingly, a lead frame 40 shown in FIG. 3A can be obtained.

(C) Forming Resin Molded Body 8

Figure 3B:
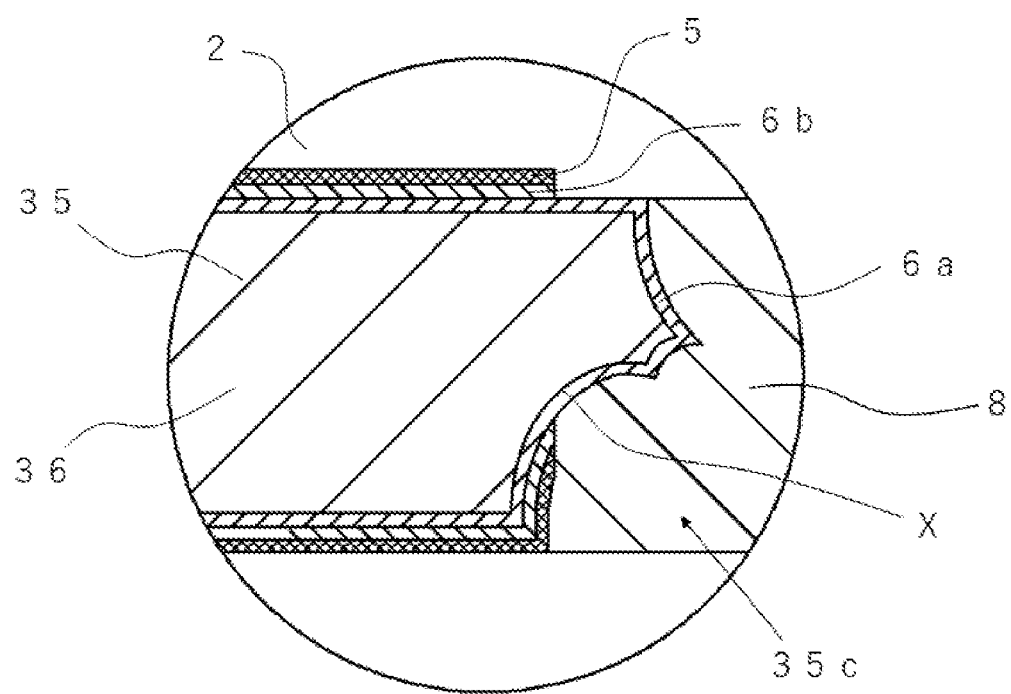
FIG. 3B is a partially enlarged view of a portion encircled with a broken line in FIG. 3A.

Next, a resin molded body 8 is formed in one piece with the lead frame 40 to obtain a first structure 50 (lead frame with resin molded body) having the lead frame 40 and the resin molded body 8, and defining a plurality of recesses 2 in the upper surface. FIG. 3A is a schematic cross-sectional end plan view of a first structure 50 that includes the lead frame 40 having the lead parts 36 illustrated in FIG. 2G. FIG. 3B is a partially enlarged view of a part encircled with a broken line in FIG. 3A. The first structure 50 includes a plurality of package regions 1 each defining a single recess 2. When forming the first structure 50, for example, the lead frame 40 is held in a resin-molding mold with each pair of lead parts 36 being at predetermined positions in corresponding one of the cavities of the resin-molding mold. Subsequently, a resin material of the resin molded body 8 is injected in the cavities and cured to obtain the first structure 50 that includes the resin molded body 8 in which resin parts 8a of respective package regions 1 are formed in one piece. The resin molded body 8 can be formed by using a transfer molding method, an injection molding method, or the like.

The upward-facing surface of each recess includes upper surfaces of the pair of lead parts 36 and the first plating 5 disposed on the upper surfaces of the metal parts 35. With this arrangement, in each individual light emitting device 100, light emitted from the at least one light emitting element 10 can be efficiently extracted to the outside.

The resin molded body 8 is formed to expose portions of the lower surface of the lead frame 40. With this arrangement, heat generated from the at least one light emitting element 10 disposed on the upward-facing surface of the recess 2 can be released efficiently from the lower-surface side of individual light emitting devices 100. In an example illustrated in FIG. 3A, the lower surface of the lead frame 40 and the lower surface of the resin molded body 8 are substantially in a same plane at the lower surface of the first structure 50. In the up-down direction, a difference in height between the lower surface of the lead frame 40 and the lower surface of the resin molded body 8 is, for example, not greater than ±10 μm.

The providing first structure 50 includes both producing or manufacturing the first structure 50 and purchasing manufactured or produced first structure 50.

(D) Forming Second Structure 60

Figure 4:
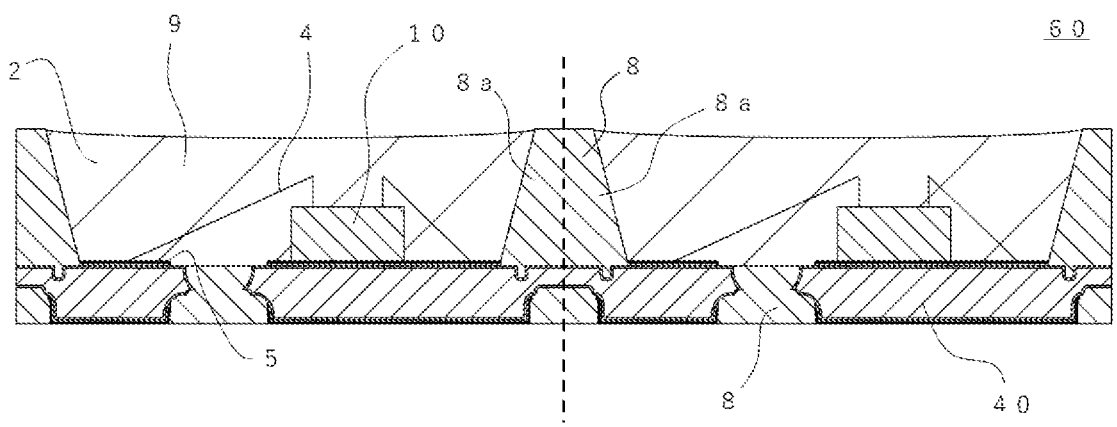
FIG. 4 is a schematic cross-sectional end plan view of a second structure according to one embodiment.

Next, at least one light emitting element 10 is disposed on the first plating 5 located on an upward surface of the recess 2 defined in the first structure 50. In the present specification, expression "disposing a light emitting element 10 on the first plating 5" refers to both the cases of the first plating 5 is opposite to the entire lower surface side of the light emitting element 10 and the first plating 5 is opposite to a portion (or portions) of the lower surface side of the light emitting element 10. As shown in FIG. 4, the light emitting element 10 includes, for example, positive and negative electrodes (not illustrated in the figures) on a sane surface side and disposed on a pair of lead parts 36 exposed on the upward-facing surface of the recess 2. The positive and negative electrodes of the light emitting element 10 are connected to respective one of the pair of lead parts 36 by wires. Alternatively, the positive and negative electrodes on the same surface side of the light emitting element 10 are opposite to the upper surfaces of the pair of lead parts 36 and disposed on the upper surfaces of the pair of lead parts 36 via an electrically conductive joining member.

Next, a sealing member 9 is disposed in each of the recesses 2 to cover corresponding one of the light emitting elements 10. The sealing member 9 may contain a fluorescent material and/or a light diffusing material. The sealing member 9 can be disposed, for example, a mixed material including a base resin material to which a fluorescent material and/or a light diffusing material is contained is applied into each recess 2 through a dispenser etc. Subsequently, curing is performed to form the sealing member 9. Sedimentation can be performed after the disposing the mixed material in the recesses 2 and before the curing. The sedimentation allows for localized distribution of the fluorescent material etc., at the upward-facing surface side in the recesses 2, which can efficiently reduce color unevenness of individual light emitting devices 100.

(E) Separating Into Individual Light-Emitting Devices 100

Figure 5A:
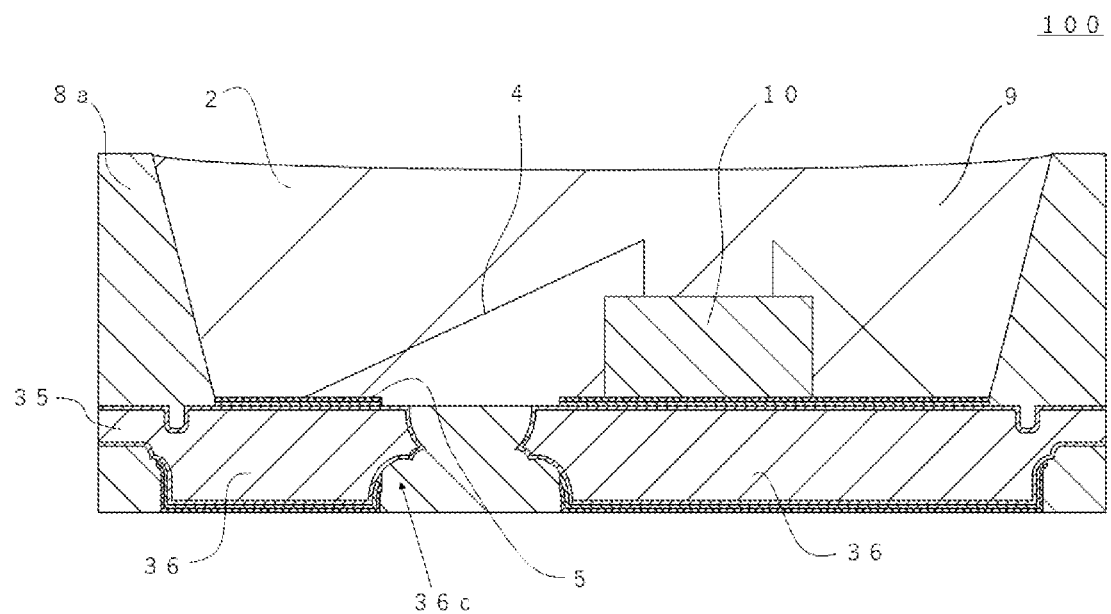
FIG. 5A is a schematic cross-sectional end plan view of a light emitting device according to one embodiment.
Figure 5B:
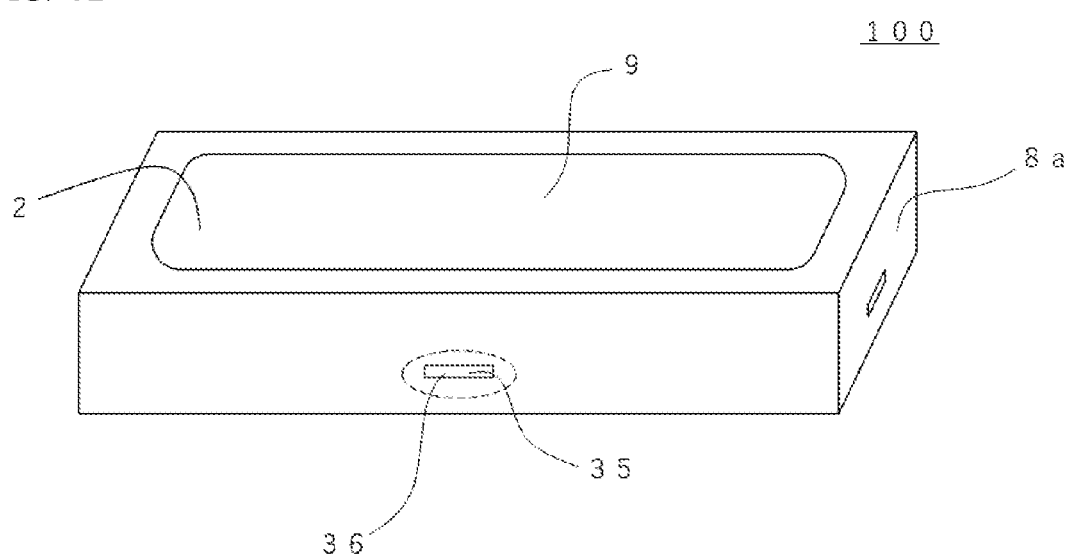
FIG. 5B is a schematic perspective view of a light emitting device according to one embodiment.
Figure 5C:
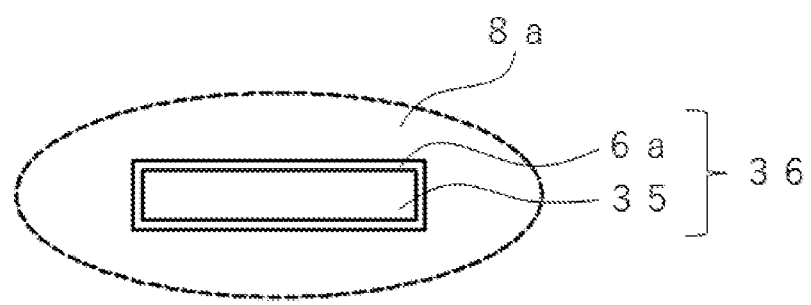
FIG. 5C is a partially enlarged view of a portion encircled with a broken line in FIG. 5B.
Figure 5D:
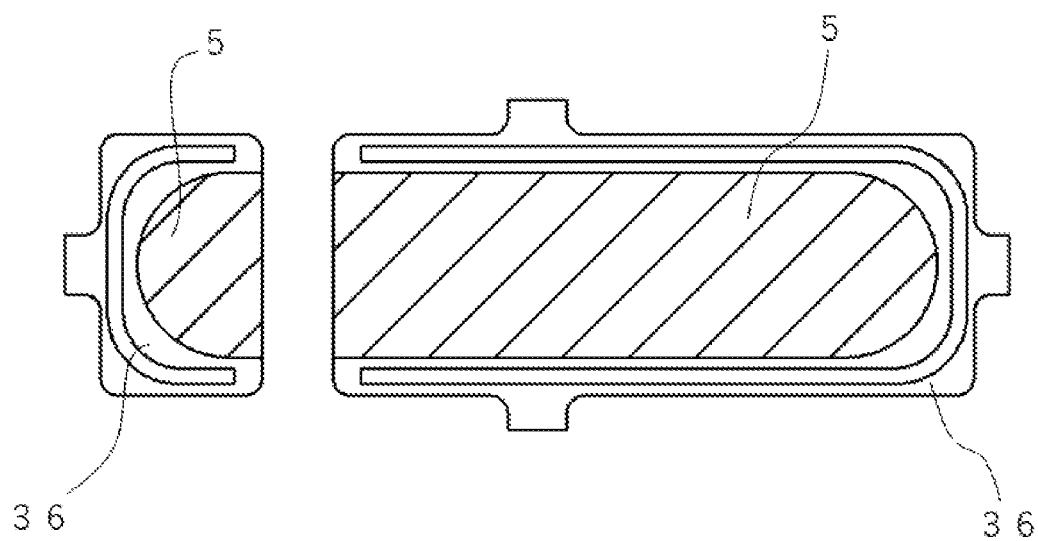
FIG. 5D is a schematic top plan view of a pair of leads.

The second structure 60 is separated into a plurality of individual light emitting devices 100. The separating can be performed by using, for example, a lead-cutting mold, a dicing saw, or a laser light. Accordingly, a plurality of light emitting devices 100, each shown in FIG. 5A, FIG. 5B, and FIG. 5C can be obtained. FIG. 5A is a schematic cross-sectional end plan view of a light emitting device 100 according to one embodiment. FIG. 5B is a schematic perspective view of a light emitting device 100 according to one embodiment. FIG. 5C is a partially enlarged view of a part encircled with a broken line in FIG. 5B. FIG. 5D is a schematic top plan view of a pair of leads 36, in which regions having the first plating 5 are shown by hatching.

As shown in FIG. 5A, the light emitting devices 100 preferably have the lead parts 36 and the resin part 8a flush with each other on the outer lateral surfaces. The lead parts 36 are not protruded outward with respect to the resin part 8a on the outer lateral surfaces of the respective light emitting devices 100, which allows to provide light emitting devices 100 of small size with a small occupying area. Though the lead parts 36 may be protruded outward with respect to the resin part 8a on the outer lateral surfaces of the light emitting devices 100, which allows efficient release of heat generated by the light emitting element 10 to the outside.

Further, as shown in FIG. 5A and FIG. 5C, on the outer lateral surfaces of each of the light emitting devices 100, it is preferable that the first plating 5 is not disposed between each of the lead parts 36 and the resin part 8a. With this arrangement, occurrence of migration of silver can be reduced or prevented. In FIG. 5C, on the lateral surfaces of the light emitting device 100, the metal part 35 and the lower metal layer 6a (for example a metal layer containing nickel or nickel alloy) covering the metal layer 35 are exposed from the resin part 8a.

Next, each component used in the method of manufacturing a light emitting device 100 according to the present invention will be described.

Metal Plate 30, Pairs of Metal Parts 35

Examples of the material of the metal plate 30 and a plurality of pairs of metal parts 35 include copper, aluminum, silver, iron, nickel, and an alloy of one or more of those metals. The metal plate 30 and the pairs of metal parts 35 substantially do not contain silver or silver alloy. In the specification, the expression "substantially does not contain silver or silver alloy" does not exclude inevitable inclusion of silver or silver alloy and a content of silver or silver alloy, for example, not greater than 0.05% by mass may be allowed. The metal plate 30 and the pairs of metal parts 35 may have a single-layer structure or a multi-layer structure (for example, a cladding material). In particular, copper or copper alloy that is inexpensive and has high heat releasing properties can be suitably used for the material of the metal plate 30 and the pairs of metal parts 35. The thickness and shape of the metal plate 30 can be appropriately determined according to the thickness, shape, etc., of the light emitting device 100. The metal plate 30 may have a flat plate shape, a partially bent or curved shape, a partially thick and partially thin shape, or the like.

The metal plate 30 includes a plurality of pairs of metal parts 35 each corresponding to a single package region 1. The metal plate 30 may include one or more metal parts in addition to the pair of first and second metal parts 35 in a single package region 1. The additional metal part(s) may serve as a heat releasing member or may serve as an electrode together with the pair of metal parts 35.

Resin Molded Body 8, Resin Part 8a

For the base resin material of the resin molded body 8 and the resin part 8a, thermosetting resin, thermoplastic resin, or the like can be employed. Specific examples of the base resin material include epoxy resin composition, silicone resin composition, modified epoxy resin composition such as silicone-modified epoxy resin composition, modified silicone resin composition such as epoxy-modified silicone resin, unsaturated polyester resin, saturated polyester resin, polyimide resin composition, modified polyimide resin composition, polyphthalamide (PPA), polycarbonate resin, polyphenylenesulfide (PPS), liquid crystal polymer (LCP), ABS resin, phenol resin, acrylic resin, and PBT resin. In particular, epoxy resin composition and/or silicone resin composition having good heat-resisting properties and good light-resisting properties is preferably used as the resin material of the resin molded body 8 and the resin part 8a.

The resin molded body 8 and the resin part 8a preferably contain a light-reflecting material in the base resin material. It is preferable that the light-reflecting material hardly absorbs light from the at least one light emitting element 10 and has a refractive index largely different from that of the base resin material. Examples of the light-reflecting material include titanium oxide, zinc oxide, silicon oxide, zirconium oxide, aluminum oxide, and aluminum nitride.

The resin molded body 8 and the resin part 8a may contain a filler material having a low reflectance to external light (in many cases, sun light) to improve the contrast of the light emitting device. In this case, the resin molded body 8 and the resin part 8a have a black color or a color close to black. Examples of the filler material include carbon such as acetylene black, activated carbon, and carbon graphite, a transmission metal oxide such as iron oxide, manganese dioxide, cobalt oxide, molybdenum oxide, or a chromatic organic pigment, which are used according to intended usage.

Light Emitting Element 10

The at least one light emitting element 10 serves as a light source of the light emitting device 100, and further serves as an excitation source of the fluorescent material. As the light emitting element 10, a light emitting diode element etc., can be used, in which a nitride-based semiconductor ($In_xAl_yGa_{1-x-y}N$, $0 \leq x$, $0 \leq y$, $x+y \leq 1$) that can emit visible light can be preferably used. The light emitting device 100 shown in FIG. 5A includes a single light emitting element 10, but the number of the light emitting elements can be appropriately determined, according to the purpose and application.

When the light emitting device 100 includes a plurality of light emitting elements 10, the plurality of light emitting elements 10 may be, for example, a plurality of blue-light emitting elements, three light emitting elements that emit blue, green, and red light, respectively, or a combination of light emitting element(s) to emit blue light and light emitting element(s) to emit green light. When the light emitting device 100 is used as the light source of a liquid crystal display device, light emitting element(s) to emit blue light, or a combination of light emitting element(s) to emit blue light and to emit green light can be preferably used. The light emitting element(s) to emit blue light and the light emitting element(s) to emit green light preferably have a half band width of 40 nm or less, more preferably 30 nm or less. With such a half band width, blue light and green light of sharp peak can be easily obtained. Accordingly, when the light emitting device 100 is used as the light source of a liquid crystal display device etc., the liquid crystal display device achieving high degree of color reproductivity can be obtained. The plurality of light emitting elements 10 can be electrically connected in series, in parallel, or in a combination of series and parallel.

Sealing Member 9

The light emitting device 100 includes a sealing member 9 covering the at least one light emitting element 10. The sealing member 9 is configured to protect the at least one light emitting element 10 etc., from external force, dust, moisture, or the like. It is preferable that the sealing member 9 can transmit 60% or greater, more preferably 90% or greater light emitted from the at least one light emitting element 10. For the base material of the sealing member 9, the resin material used for the resin molded body 8 can be used. The sealing member 9 may have a single layer structure or a multilayer structure. Further, a light diffusing material such as titanium oxide, silicon oxide, zirconium oxide, or/and aluminum oxide may be dispersed in the sealing member 9.

The sealing member 9 may contain one or more fluorescent materials each configured to convert the wavelength of light from the corresponding light-emitting element(s) 10. The fluorescent materials are those that can be excited by the light from corresponding light-emitting element(s) 10, and examples of the fluorescent materials include $(Ca, Sr, Ba)_5(PO_4)_3(Cl, Br):Eu$, $(Sr, Ca, Ba)_4Al_{14}O_{25}:Eu$, $(Ca, Sr, Ba)_8MgSi_4O_{16}(F, Cl, Br)_2:Eu$, $(Y, Lu, Gd)_3(Al, Ga)_5O_{12}:Ce$, $(Ca, Sr)AlSiN_3:Eu$, $3.5MgO \cdot 0.5MgF_2 \cdot GeO_2:Mn$, $(x-s)MgO \cdot (s/2)Sc_2O_3 \cdot yMgF_2 \cdot uCaF_2 \cdot (1-t)GeO_2 \cdot (t/2)Mt_2O_3:zMn$ ($2.0 \leq x \leq 4.0$, $0 < y < 1.5$, $0 < z < 0.05$, $0 \leq s < 0.5$, $0 < t < 0.5$, and $0 \leq u < 1.5$), $Ca_3Sc_2Si_3O_{12}:Ce$, $CaSc_2O_4:Ce$, $(La, Y)_3Si_6N_{11}:Ce$, $(Ca, Sr, Ba)_3Si_6O_9N_4:Eu$, $(Ca, Sr, Ba)_3Si_6O_{12}N_2:Eu$, $(Ba, Sr, Ca)Si_2O_2N_2:Eu$, $(Ca, Sr, Ba)_2Si_5N_8:Eu$, $(Ca, Sr, Ba)_3SiO_{12}N_2:Eu$, $(Ba, Sr, Ca)Si_2O_2N_2:Eu$, $(Ca, Sr, Ba)_2Si_5N_8:Eu$, $(Ca, Sr, Ba)S:Eu$, $(Ba, Sr, Ca)Ga_2S_4:Eu$, $K_2(Si, Ti, Ge)F_6:Mn$, $Si_{6-z}Al_zO_zN_{8-z}:Eu$ ($0 < z < 4.2$).

The light diffusing material and/or the fluorescent material is preferably contained in a range of, for example, about 10 to about 150 weight % with respect to 9 the total weight of the sealing member 9.

Wire 4

For the material of the wires 4, a metal such as gold, copper, silver, platinum, aluminum, or palladium, or an alloy of one or more of those can be used.

Bonding Member

For the bonding member, an electrically conductive joining member or an electrically insulating joining member can be used. Examples of the electrically conductive bonding member include conductive pastes of silver, gold, palladium, or the like, eutectic solder materials such as gold-tin, tin-silver-copper, or the like, brazing materials such as low-melting-point metals or the like, and bumps or the like containing silver, gold, or the like. Examples of electrically insulating bonding member include epoxy resin composition, silicone resin composition, polyimide resin composition, modified resin thereof, and hybrid resin thereof. When using such resin, a metal layer having high reflectance such as aluminum film or silver film, or a dielectric light-reflecting film may be disposed on the mounting surface of the at least one light emitting element 10, in view of degradation caused by light or heat from the at least one light emitting element 10.

Variation

In the step (B) of forming lead frame 40, disposing a mask on the metal plated 30 in the second regions Y that are other than the first regions X of the metal plate 30, using an electrodeposition method, disposing a resist film 7 with respect to the metal plate 30 having the mask, drying the resist film 7, and removing the mask may be performed in place of the steps (B-1) to (B-3). Through the operations as described above, the metal plate 30 having the metal parts 35 provided with the resist film 7 only on the first regions X can be obtained. Electrically conducting material or electrically insulating material can be used for the mask, and an electrically insulating mask is preferably used. When an electrically insulating mask is used, the resist film 7 is not disposed on the regions with the mask disposed thereon, which can facilitate operation of removing the mask. For the mask, a metal mask, a rubber mask, or the like, can be used.

Figure 6:
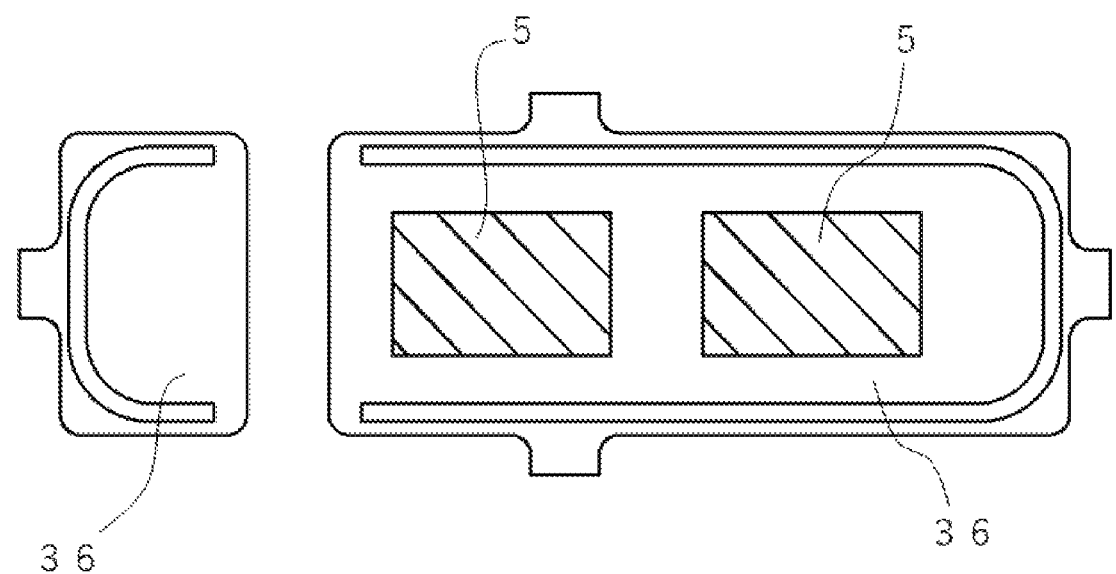
FIG. 6 is a schematic top plan view showing an example of positional arrangement of the first plating.

The configuration of the first plating 5 disposed on an upper surface of each pair of lead parts 36 can be variously modified. The first plating 5 can be applied covering the entire of the upper surfaces of the metal parts 35 of the upward-facing surfaces of the recesses 2. With this arrangement, light emitted from the at least one light-emitting element 10 can be extracted to the outside efficiently. As shown in FIG. 6, the first plating 5 can be disposed only on one or more regions of the upward-facing surface of the recess 2, to be located under the corresponding light-emitting element(s) 10. In the embodiment shown in FIG. 6, two light emitting elements 10 are configured to be arranged. This arrangement allows efficient extraction of light emitted from the light-emitting elements 10 to the outside while reducing the usage amount of the first plating 5 containing silver or silver alloy, which can increase the resistance of the light emitting devices 100 against sulfurization or the like. Moreover, the usage amount of silver or silver alloy can be reduced, which can reduce manufacturing cost of the light emitting devices. The region has a flat surface area, for example, in a range of 80% to 165%, preferably in a range of 95% to 150%, with respect to the flat surface area of corresponding light emitting element 10.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing light emitting devices, the method comprising:
    providing a first structure, the providing a first structure comprising:
        providing a lead frame, the providing a lead frame comprising:
            providing a metal plate having a plurality of pairs of first and second metal parts, each of the first and second metal parts including at least one first region and at least one second region;
            using an electrodeposition technique, whereby the lead frame is immersed in an aqueous solution, disposing a mask of a resist film on the at least one first region;
            disposing a first plating containing silver or silver alloy on the at least one second region; and
            removing the resist film;
        molding a resin molded body in one piece with the lead frame with parts of a lower surface of the lead frame being exposed, wherein, the first structure includes an upper surface defining a plurality of recesses each having an upward-facing surface, at least parts of the first plating being located at the upward-facing surface of each of the plurality of recesses;
    providing a second structure, the providing a second structure comprising:
        disposing at least one light-emitting element on the first plating located at the upward-facing surface of each of the plurality of recesses; and
        disposing a sealing member covering the at least one light-emitting element in each of the plurality of recesses; and
    separating the second structure into a plurality of individual light emitting devices, wherein the end surface of the first metal part which is paired with the second metal part has a first projection P, which is located closer to the second metal part than the upper surface of the first metal part and the lower surface of the first metal part, and at least a part of the first protection P is exposed from the first plated layer.

2. The method of manufacturing light emitting devices according to claim 1, wherein the first plating covers only one or more regions each located under corresponding light-emitting element, and each of the one or more regions has a flat surface area in a range of 80% to 165% with respect to the flat surface area of the corresponding light-emitting element.

3. The method of manufacturing light emitting devices according to claim 1, wherein the first plating covers entire upper surfaces of the first and second metal parts at the upward-facing surface of each of the recesses.

4. The method of manufacturing light emitting devices according to claim 1, wherein the silver alloy contained in the first plating is silver-gold alloy, silver-indium alloy or silver-palladium alloy.

5. The method of manufacturing light emitting devices according to claim 1, wherein the first plating containing silver or silver alloy has a thickness of 0.1 μm or greater.

6. The method of manufacturing light emitting devices according to claim 1, wherein the first plating contains at least 85% of silver or silver alloy by mass.

7. The method of manufacturing light emitting devices according to claim 1, wherein the providing the first structure comprises:
    disposing the resist film on surfaces including an upper surface, a lower surface, and an end surface and corners of each of the first and second metal parts,
    drying the resist film disposed on the first and second metal parts,
    irradiating light on respective portions of the resist film located in the first regions to render the respective portions of the resist film located in the first regions insoluble to a developer solution,
    removing portions of the resist film located in the second regions using the developer solution, and
    subsequently to disposing the first plating, removing portions of the resist film located in the first regions using a resist-removing solution.

8. The method of manufacturing light emitting devices according to claim 7, wherein
in the irradiating light on the respective portions of the resist film, the light is irradiated from above, below, or above and below the metal plate, wherein
the light is irradiated through a light-shielding mask, or using an irradiation device configured to emit light of a predetermined pattern.

9. The method of manufacturing light emitting devices according to claim 8, wherein:
in a cross-sectional view perpendicular to the upper surface of each of the pairs of first and second metal parts,
a first corner portion connecting the upper surface and the end surface of the first metal part is located closer to the second metal part than a second corner portion connecting the lower surface and the end surface of the first metal part, and
in the irradiating light on the respective portions of the resist film, the light is irradiated on the resist film from below the metal plate with an end of the light-shielding mask or an end of the light of the predetermined pattern in conformity to a location between the first corner portion and the second corner portion of the first metal part.

10. The method of manufacturing light emitting devices according to claim 1, wherein the providing the first structure comprises:
disposing the resist film on surfaces including an upper surface, a lower surface, and end surfaces and the corners of each of the first and second metal parts,
drying the resist film disposed on the first and second metal parts,
irradiating light on respective portions of the resist film located in the second regions to render the respective portions of the resist film located in the second regions soluble to a developer solution,
removing portions of the resist film located in the second regions using the developer solution, and
subsequently to disposing the first plating, removing portions of the resist film located in the first regions using a resist-removing solution.

11. The method of manufacturing light emitting devices according to claim 10, wherein
in the irradiating light on the respective portions of the resist film, the light is irradiated from above, below, or above and below the metal plate, wherein
the light is irradiated through a light-shielding mask, or using an irradiation device configured to emit light of a predetermined pattern.

12. The method of manufacturing light emitting devices according to claim 11, wherein:
in a cross-sectional view perpendicular to the upper surface of each of the pairs of first and second metal parts,
a first corner portion connecting the upper surface and the end surface of the first metal part is located closer to the second metal part than a second corner portion connecting the lower surface and the end surface of the first metal part, and
in the irradiating light on the respective portions of the resist film, the light is irradiated on the resist film from below the metal plate with an end of the light-shielding mask or an end of the light of the predetermined pattern in conformity to a location between the first corner portion and the second corner portion of the first metal part.

13. The method of manufacturing light emitting devices according to claim 1, wherein the method further comprises disposing a second plating on the surfaces of the metal parts before the disposing the first plating, such that the second plating covers the first regions or both the first regions and second regions.

14. The method of manufacturing light emitting devices according to claim 13, wherein the second plating includes at least one metal layer containing copper, copper alloy, gold, gold alloy, nickel, nickel alloy, palladium, palladium alloy, rhodium or rhodium alloy.

15. The method of manufacturing light emitting devices according to claim 14, wherein the first plating contains at least 85% of silver or silver alloy by mass.

16. The method of manufacturing light emitting devices according to claim 1, wherein each of the first and second metal parts includes a first corner portion connecting the upper surface and the end surface, and a second corner portion connecting the lower surface and the end surface, and the resist film continuously covers at least one of the first corner portion and the second corner portion.

17. The method of manufacturing light emitting devices according to claim 16, wherein the method further comprises disposing a second plating on the surfaces of the metal parts before the disposing the first plating, such that the second plating covers the first regions or both the first regions and second regions.

18. The method of manufacturing light emitting devices according to claim 17, wherein the second plating includes at least one metal layer containing copper, copper alloy, gold, gold alloy, nickel, nickel alloy, palladium, palladium alloy, rhodium or rhodium alloy.

19. The method of manufacturing light emitting devices according to claim 18, wherein the first plating contains at least 85% of silver or silver alloy by mass.

* * * * *